United States Patent
Giri et al.

(10) Patent No.: US 11,579,651 B2
(45) Date of Patent: *Feb. 14, 2023

(54) LOW DROP REAL-TIME-CLOCK BATTERY VOLTAGE CONTROL CIRCUIT FOR APPLICATION SPECIFIC INTEGRATED CIRCUIT IN AN ENGINE CONTROL MODULE

(71) Applicant: Cummins Inc., Columbus, IN (US)

(72) Inventors: Abhik Giri, Baharagora (IN); Mark Swain, Columbus, IN (US); Ashish Raj Jain, Indianapolis, IN (US); Ming Feng, Nashville, TN (US); Astha Ganjoo, Pune (IN); Shreya Ghatge, Chattisgarh (IN)

(73) Assignee: Cummins Inc., Columbus, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/526,674

(22) Filed: Nov. 15, 2021

(65) Prior Publication Data
US 2022/0075406 A1 Mar. 10, 2022

Related U.S. Application Data

(63) Continuation of application No. 16/844,665, filed on Apr. 9, 2020, now Pat. No. 11,175,690, which is a continuation of application No. PCT/US2017/055911, filed on Oct. 10, 2017.

(51) Int. Cl.
*B60R 16/00* (2006.01)
*G06F 1/14* (2006.01)
*B60R 16/033* (2006.01)
*H03K 17/567* (2006.01)
*G05F 1/46* (2006.01)

(52) U.S. Cl.
CPC .............. *G06F 1/14* (2013.01); *B60R 16/033* (2013.01); *H03K 17/567* (2013.01); *G05F 1/46* (2013.01)

(58) Field of Classification Search
CPC ......... G06F 1/14; B60R 16/033; B60R 16/03; H03K 17/567; G05F 1/46
USPC ........................................ 307/9.1
See application file for complete search history.

(56) References Cited

U.S. PATENT DOCUMENTS

| | | | | |
|---|---|---|---|---|
| 5,650,974 A | * | 7/1997 | Yoshimura | G11C 5/141 365/228 |
| 5,796,175 A | * | 8/1998 | Itoh | H02J 9/06 307/64 |
| 5,886,561 A | * | 3/1999 | Eitan | H02J 9/061 307/64 |
| 5,941,915 A | | 8/1999 | Federle et al. | |
| 5,999,876 A | | 12/1999 | Irons et al. | |

(Continued)

FOREIGN PATENT DOCUMENTS

WO WO-2017/083272 A1 5/2017

*Primary Examiner* — Ryan Jager
(74) *Attorney, Agent, or Firm* — Foley & Lardner LLP

(57) ABSTRACT

Systems and apparatuses include a circuit structured to communicate with a real-time-clock battery and to selectively communicate with a vehicle battery, inhibit communication between the real-time-clock battery and a controller when a first voltage is received from the vehicle battery, and provide a communication from the real-time-clock battery to the controller when the first voltage is not received.

17 Claims, 2 Drawing Sheets

(56) References Cited

U.S. PATENT DOCUMENTS

| | | | | |
|---|---|---|---|---|
| 6,016,045 | A * | 1/2000 | Thomas | H02J 9/061 |
| | | | | 180/68.5 |
| 6,603,365 | B1 * | 8/2003 | Dotzler | G06F 1/30 |
| | | | | 331/173 |
| 8,018,091 | B2 * | 9/2011 | Liu | G06F 1/263 |
| | | | | 307/64 |
| 8,207,633 | B2 * | 6/2012 | Oleksiewicz | H01M 50/20 |
| | | | | 307/64 |
| 8,933,587 | B2 * | 1/2015 | Nikolov | H02J 9/06 |
| | | | | 307/64 |
| 9,725,055 | B2 * | 8/2017 | Gonzalez, Jr. | B60R 16/033 |
| 9,929,590 | B2 * | 3/2018 | Nikolov | G06F 1/30 |
| 10,442,373 | B2 * | 10/2019 | Yoon | H02J 7/007 |
| 10,992,166 | B2 * | 4/2021 | Hsieh | H02J 9/002 |
| 11,175,690 | B2 * | 11/2021 | Giri | B60R 16/03 |
| 11,218,002 | B2 * | 1/2022 | Hofer | H01M 10/4257 |
| 2003/0234730 | A1 | 12/2003 | Arms et al. | |
| 2008/0104433 | A1 * | 5/2008 | May | G06F 1/26 |
| | | | | 713/300 |
| 2009/0184746 | A1 * | 7/2009 | Fahrenbruch | H01L 31/02021 |
| | | | | 327/427 |
| 2009/0184905 | A1 * | 7/2009 | Dai | G09G 3/20 |
| | | | | 345/82 |
| 2011/0309680 | A1 * | 12/2011 | Oleksiewicz | H02J 9/06 |
| | | | | 307/66 |
| 2012/0261994 | A1 * | 10/2012 | Nikolov | H02J 9/06 |
| | | | | 307/66 |
| 2015/0108835 | A1 * | 4/2015 | Nikolov | G06F 1/30 |
| | | | | 307/23 |
| 2017/0088071 | A1 * | 3/2017 | Min | B60R 16/04 |
| 2020/0143609 | A1 * | 5/2020 | Neelakantan | G07C 5/0808 |
| 2020/0233450 | A1 * | 7/2020 | Giri | H03K 17/567 |
| 2020/0274387 | A1 * | 8/2020 | Matsuzaki | H02J 9/06 |
| 2022/0075406 | A1 * | 3/2022 | Giri | H03K 17/567 |

* cited by examiner

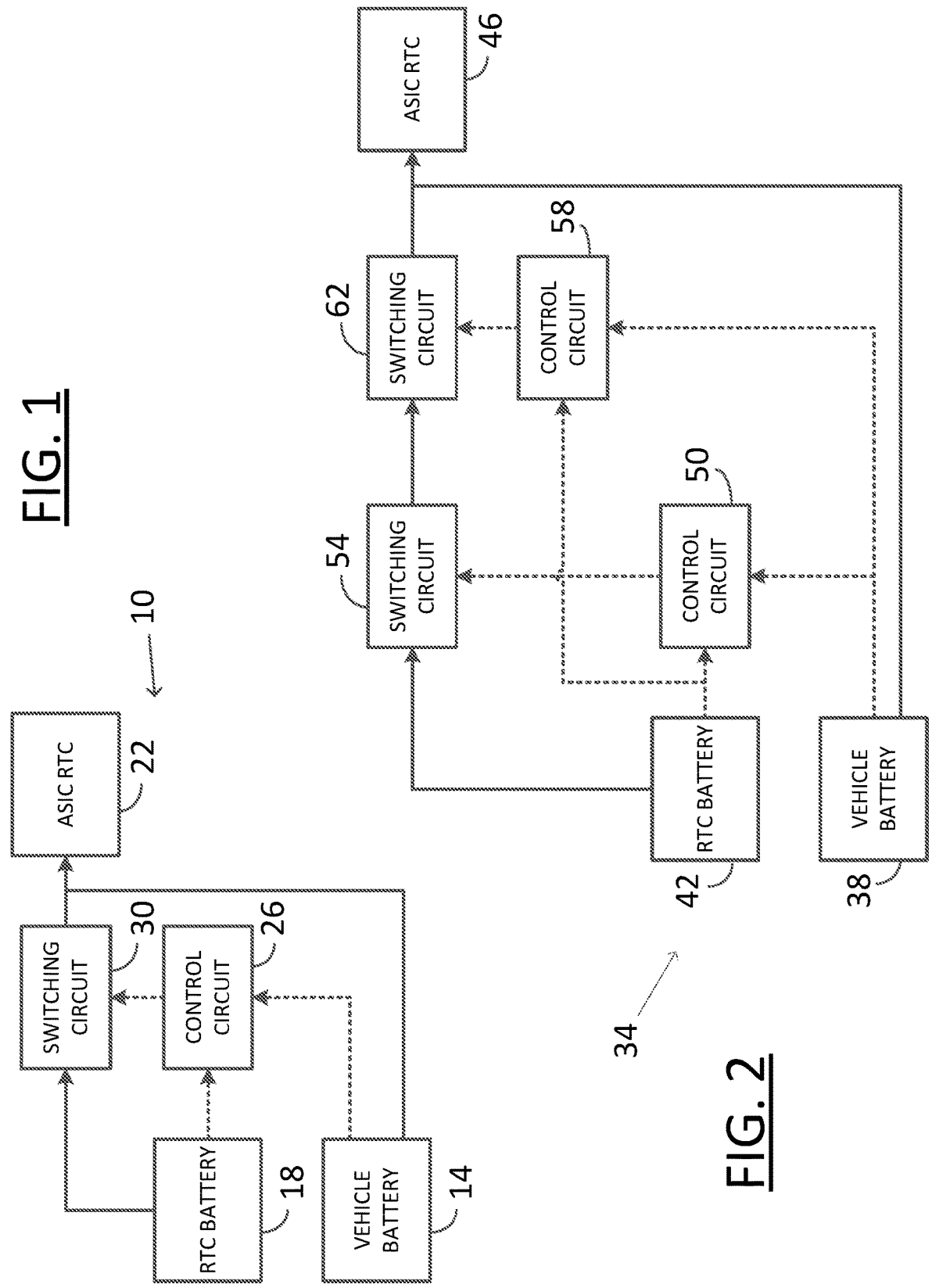

LOW DROP REAL-TIME-CLOCK BATTERY VOLTAGE CONTROL CIRCUIT FOR APPLICATION SPECIFIC INTEGRATED CIRCUIT IN AN ENGINE CONTROL MODULE

RELATED APPLICATIONS

This application is a continuation application of U.S. patent application Ser. No. 16/844,665 filed on Apr. 9, 2020 and now issued as U.S. Pat. No. 11,175,690, which is a continuation application of International Application No. PCT/US2017/055911 filed on Oct. 10, 2017, each of which are hereby incorporated by reference in their entirety.

TECHNICAL FIELD

The present disclosure relates to engine control modules. More particularly, the present disclosure relates to systems and methods for providing real-time-clock battery voltage control for an application specific integrated circuit.

BACKGROUND

A real-time-clock (RTC) is a computer device often in the form of an integrated circuit that counts time in a computer or controller system. It is desirable for real time clocks to be provided with continuous power so that accurate and ongoing time can be maintained for the associated computing device or controller. In some systems, an RTC backup battery is provided and connected to the RTC via blocking diodes. Blocking diodes tend to draw a significant amount of voltage leading to a reduced available voltage for operation of the RTC in the event of a loss of main power supply. In automotive systems, a series blocking diodes protects against accidental reverse battery connections when the battery is replaced or the car is jump started. While blocking diodes are easy to understand and apply, their forward drop results in significant power dissipation, making them unsuitable in both low voltage and high current applications. In low voltage applications, the forward voltage drop becomes a limiting factor for a circuit's operating range, even when using a Schottky barrier diode. At least 500 mV of supply headroom is lost across a series diode—a substantial degradation in 12V automotive systems where the supply can drop to as low as 4V during cold crank.

Since diodes operate at a fixed voltage drop of 400 mV to 700 mV minimum, regardless of current rating, power dissipation becomes an issue in the 1 A-2 A range, for surface mount applications. In applications greater than 5 A, power dissipation becomes a major issue, requiring elaborate thermal layouts or costly heat sinks to keep the diode cool.

SUMMARY

One embodiment relates to an apparatus that includes a control circuit and a switching circuit. The control circuit is structured to communicate with a real-time-clock battery and to selectively communicate with a vehicle battery. The control circuit is structured in an OFF arrangement when a wake supply voltage is received from the vehicle battery and in an ON arrangement when no wake supply voltage is received. The switching circuit is structured to provide communication between the real-time-clock battery and a real-time-clock power pin of a controller with a voltage drop of about 0.1 volts or less when the control circuit is in the ON arrangement and to inhibit communication between the real-time-clock battery and the real-time-clock power pin when the control circuit is in the OFF arrangement.

Another embodiment relates to a system that includes a regulator structured to receive power from a vehicle battery and output a wake supply voltage, a low drop out regulator structured to receive the wake supply voltage and output a regulated output voltage to a real-time-clock power pin of a controller, a first control circuit structured to communicate with a real-time-clock battery and to receive the wake supply voltage from the regulator, the first control circuit structured in an OFF arrangement when the wake supply voltage is received from the vehicle battery and in an ON arrangement when no wake supply voltage is received, a first switching circuit structured to provide communication between the real-time-clock battery and the real-time-clock power pin when the first control circuit is in the ON arrangement and to inhibit communication between the real-time-clock battery and the real-time-clock power pin when the first control circuit is in the OFF arrangement, a second control circuit structured to communicate with the real-time-clock battery and to receive the wake supply voltage from the regulator, the second control circuit structured in an OFF arrangement when the wake supply voltage is received from the vehicle battery and in an ON arrangement when no wake supply voltage is received, and a second switching circuit structured to provide communication between the real-time-clock battery and the real-time-clock power pin when the second control circuit is in the ON arrangement and to inhibit communication between the real-time-clock battery and the real-time-clock power pin when the second control circuit is in the OFF arrangement.

Another embodiment relates to a method that includes providing a wake supply voltage from a primary battery to a control circuit, providing a real-time-clock battery voltage from a real-time-clock battery to a switching circuit when the wake supply voltage is not provided to the control circuit, and providing the real-time-clock battery voltage from the real-time-clock battery to a real-time-clock power pin of a controller when the real-time-clock voltage is provided to the switching circuit.

These and other features, together with the organization and manner of operation thereof, will become apparent from the following detailed description when taken in conjunction with the accompanying drawings.

BRIEF DESCRIPTION OF THE FIGURES

FIG. 1 is a schematic diagram of a battery voltage control circuit according to one embodiment.

FIG. 2 is a schematic diagram of another battery voltage control circuit according to one embodiment.

DETAILED DESCRIPTION

Figure 3:
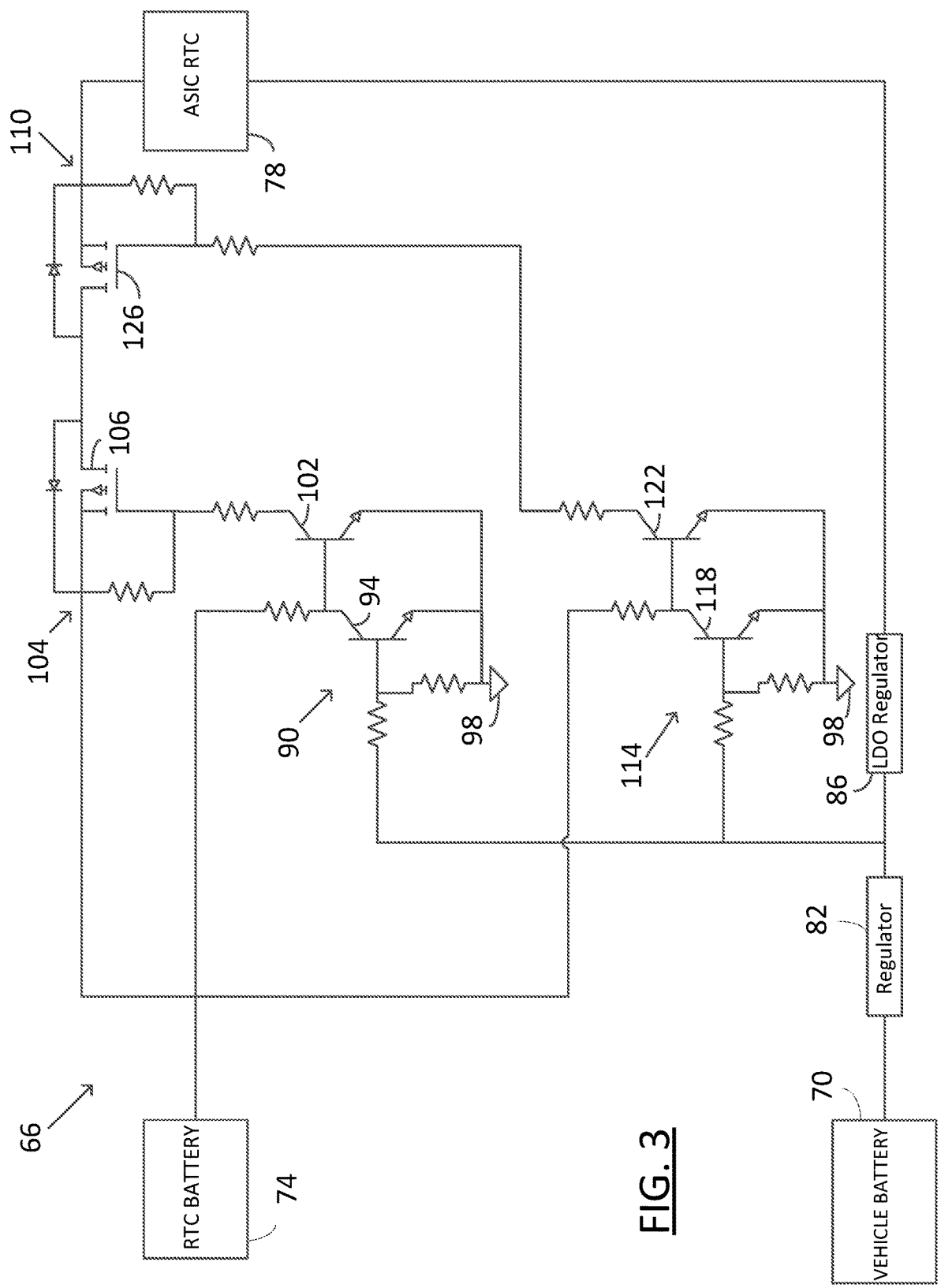
FIG. 3 is a schematic diagram of the battery voltage control circuit of FIG. 2 according to one embodiment.

Following below are more detailed descriptions of various concepts related to, and implementations of, methods, apparatuses, and systems for a low drop real-time-clock battery voltage control circuit for an application specific integrated circuit in an engine control module. The various concepts introduced above and discussed in greater detail below may be implemented in any number of ways, as the concepts described are not limited to any particular manner of implementation. Examples of specific implementations and applications are provided primarily for illustrative purposes.

Referring to the figures generally, the various embodiments disclosed herein relate to systems, apparatuses, and methods for controlling power delivered to a real-time-clock (RTC) associated with an application specific integrated circuit (ASIC). In some embodiments, the ASIC is a part of a larger engine control module (ECM) that controls an engine. For example, the engine may be an internal combustion engine. In some embodiments, the engine is a diesel engine of a vehicle in the form of a truck. A system for controlling power includes a first power supply in the form of a main or vehicle battery, and a second power supply in the form of an RTC battery. The system includes first and second control circuits that utilize switching components (e.g., a bipolar-junction transistor (BJT)) that control corresponding first and second switching circuits (e.g., a metal-oxide semiconductor field effect transistor (MOSFET)) that selectively provide power from the RTC battery to the RTC in the event of loss of power from the main power supply.

As shown in FIG. 1, an RTC power control system 10 includes a primary power supply in the form of a vehicle battery 14 and a secondary power supply in the form of an RTC battery 18. The vehicle battery 14 and the RTC battery 18 are selectively coupled to an RTC power pin 22 of an ASIC associated with a controller (e.g., ECM of a vehicle). In some embodiments, the vehicle battery 14 is electronically coupled to the RTC power pin 22 through various conditioners, filters, regulators, and other components to condition the voltage and current to desirable levels. In some embodiments, the RTC battery 18 is a coin type battery structured to provide between 3.2 and 3.7 volts. In some embodiments, the secondary power supply is a conditioned power supply, a solar power supply, or another power supply as desired.

The vehicle battery 14 and the RTC battery 18 are in communication with a control circuit 26 that is structured to control operation of a switching circuit 30. The switching circuit 30 is controlled based on presence or absence of signals (e.g., power) received from the vehicle battery 14 at the control circuit 26. The switching circuit 30 is coupled between the RTC battery 18 and the RTC power pin 22 to selectively provide and inhibit power communication between the RTC battery 18 and the RTC power pin 22.

In operation, when the vehicle battery 14 is providing power and the RTC battery 18 is providing power (i.e., both power supplies are connected and providing power), the control circuit 26 provides an open command to the switching circuit 30. When the switching circuit 30 receives the open command, a short or open connection is realized between the RTC battery 18 and the RTC power pin 22 so that no power is transmitted from the RTC battery 18 to the RTC power pin 22. When the vehicle battery 14 is not providing power and the RTC battery 18 is providing power (e.g., the primary power supply is disconnected, the vehicle battery 14 is removed), the control circuit 26 provides a close command to the switching circuit 30. When the switching circuit 30 receives the close command, a connection is realized between the RTC battery 18 and the RTC power pin 22 so that power is transmitted from the RTC battery 18 to the RTC power pin 22.

In some embodiments, the vehicle battery 14 may be removed by a service technician or another individual or may be compromised due to damage or accidental disconnection. In the event of a disconnection of the vehicle battery 14, the RTC battery 18 is connected to the RTC power pin 22 by the control circuit 26 and the switching circuit 30 so that the RTC of the ASIC can continue operation without a break in time continuity.

As shown in FIG. 2, an RTC power control system 34 includes a primary power supply in the form of a vehicle battery 38 and a secondary power supply in the form of an RTC battery 42. The vehicle battery 38 and the RTC battery 42 are selectively coupled to an RTC power pin 46 of an ASIC associated with a controller (e.g., ECM of a vehicle). The vehicle battery 38 and the RTC battery 42 are in communication with a first control circuit 50 that is structured to control operation of a first switching circuit 54. The vehicle battery 38 and the RTC battery 42 are also in communication with a second control circuit 58 that is structured to control operation of a second switching circuit 62. The first switching circuit 54 and the second switching circuit 62 are coupled between the RTC battery 42 and the RTC power pin 46 to selectively provide and inhibit power communication between the RTC battery 42 and the RTC power pin 46. In some embodiments, the second switching circuit 62 functions to inhibit reverse power flow into the RTC power control system 34 from the RTC power pin. For example, when the vehicle battery 38 is connected and providing conditioned power to the RTC power pin, an opportunity exists for a reverse flow of power. The second switching circuit 62 then acts as a gate or a fence that inhibits reverse power flow.

In operation, when the vehicle battery 38 is providing power and the RTC battery 42 is providing power (i.e., both power supplies are connected and providing power), the first control circuit 50 provides an open command to the first switching circuit 54, and the second control circuit 58 provides an open command to the second switching circuit 62. When the first switching circuit 54 and the second switching circuit 62 receive the open commands, a short or open connection is realized between the RTC battery 42 and the RTC power pin 46 so that no power is transmitted from the RTC battery 42 to the RTC power pin 46. When the vehicle battery 38 is not providing power and the RTC battery 42 is providing power (e.g., the primary power supply is disconnected, the vehicle battery 38 is removed), the first control circuit 50 provides a close command to the first switching circuit 54, and the second control circuit 58 provides a close command to the second switching circuit 62. When the first switching circuit 54 and the second switching circuit 62 receive the close commands, a connection is realized between the RTC battery 42 and the RTC power pin 46 so that power is transmitted from the RTC battery 42 to the RTC power pin 46.

As shown in FIG. 3, an RTC power control system 66 includes a primary power supply in the form of a vehicle battery 70 and a secondary power supply in the form of an RTC battery 74. The vehicle battery 70 and the RTC battery 74 are selectively coupled to an RTC power pin 78 of an ASIC associated with a controller (e.g., ECM of a vehicle). In some embodiments, the vehicle battery 70 provides a vehicle battery voltage of about twelve volts (12.0 V), a regulator 82 receives the vehicle battery voltage and outputs a wake supply voltage of about five volts (5.0 V), and a low drop out (LDO) regulator 86 receives the wake supply voltage and outputs a regulated output voltage of about 3.3 volts. In some embodiments, the vehicle battery voltage, the wake supply voltage, and the regulated output voltage are different as desired and/or necessitated by the RTC power control system 66. In some embodiments, the regulated output voltage (e.g., 3.3 V) is supplied to the RTC power pin 78 and provides power to the RTC while the vehicle battery 70 is connected and providing power.

In some embodiments, the RTC battery 74 is a coin type battery that provides a RTC battery voltage of between about 3.2 volts and about 3.7 volts. For desirable operation, the RTC power pin 78 should receive a minimum operating voltage that may be about three volts (3.0 V). In some embodiments, the RTC battery voltage is close to the minimum operating voltage and a power control system with a minimum voltage drop is desirable.

The RTC power control system 66 includes a first control circuit 90 having a primary control in the form of a primary bipolar junction transistor (BJT) 94 structured so that the base is in communication with the wake supply voltage output by the regulator 82, the collector is in communication with the RTC battery voltage output by the RTC battery 74, and the emitter is in communication with a ground plane 98. The first control circuit 90 also includes a secondary control in the form of a secondary BJT 102 structured so that the base is in communication with the RTC battery voltage output by the RTC battery 74, the collector is in communication with a first switching circuit 104, and the emitter is in communication with the ground plane 98.

The first switching circuit 104 includes a first metal-oxide semiconductor field-effect transistor (MOSFET) 106 structured so that the gate is in communication with the RTC battery voltage output by the RTC battery 74 in series with a resistor, the source is in communication with the RTC battery voltage output by the RTC battery 74, and the drain is in communication with a second switching circuit 110. The gate is also in communication with the collector of the secondary BJT 102.

The RTC power control system 66 also includes a second control circuit 114 having a primary control in the form of a primary bipolar junction transistor (BJT) 118 structured so that the base is in communication with the wake supply voltage output by the regulator 82, the collector is in communication with the RTC battery voltage output by the RTC battery 74, and the emitter is in communication with the ground plane 98. The second control circuit 114 also includes a secondary control in the form of a secondary BJT 122 structured so that the base is in communication with the RTC battery voltage output by the RTC battery 74, the collector is in communication with the second switching circuit 110, and the emitter is in communication with the ground plane 98.

The second switching circuit 110 includes a second MOSFET 126 structured so that the gate is in communication with the collector of the secondary BJT 122 and the RTC power pin 78 in series with a resistor, the source is in communication with the RTC power pin 78, and the drain is in communication with the drain of the first MOSFET 106.

In operation, while the vehicle battery 70 is connecting and providing power, the wake supply voltage is provided by the regulator 82 so that the bases of the primary BJTs 94, 118 of the first control circuit 90 and the second control circuit 114 are energized and the primary BJTs 94, 118 are arranged in an ON arrangement with current provided between the collectors and the emitters. When the primary BJTs 94, 114 are ON, the RTC battery voltage is dropped to ground so that the base of the secondary BJTs 102, 122 of the first control circuit 90 and the second control circuit 114 are not energized and the secondary BJTs 102, 122 are arranged in an OFF arrangement with current inhibited between the collectors and the emitters. As described above, when the vehicle battery 70 is connected and providing power, the first control circuit 90 is arranged in an OFF arrangement and the second control circuit 114 is arranged in an OFF arrangement.

When the first control circuit 90 is in the OFF arrangement, then the first MOSFET 106 of the first switching circuit 104 is controlled to an OFF arrangement with no current flowing to the drain. When the second control circuit 114 is in the OFF arrangement, then the second MOSFET 126 of the second switching circuit 110 is controlled to an OFF arrangement and current flow from the drain to the source is inhibited. When the vehicle battery 70 is connected and providing power, the RTC power pin 78 receives the regulated output voltage from the LDO regulator 86, and the RTC battery 74 is isolated within the RTC power control system 66, such that substantially no power draw occurs. In some embodiments, the RTC battery 74 is isolated because the first MOSFET 106, and the primary BJTs 94, 118 are arranged in the OFF arrangements.

When the vehicle battery 70 is removed, decoupled, or is otherwise no longer providing power, then the wake supply voltage is not provided by the regulator 82 and the primary BJTs 94, 118 are arranged in an OFF arrangement where current is inhibited from flowing between the collectors and emitters. The OFF arrangements of the primary BJTs 94, 118 allow the bases of the secondary BJTs 102, 122 to be energized, thereby actuating the secondary BJTs 102, 122 to an ON arrangement with current flowing between the collectors and emitters. In this arrangement, with the primary BJTs 94, 118 OFF and the secondary BJTs 102, 122 ON, the first control circuit 90 and the second control circuit 114 can be said to be in ON arrangements.

When the first control circuit 90 is ON, then the first switching circuit 104 including the first MOSFET 106 is controlled to an ON arrangement with current flowing from the source to the drain. With the first MOSFET 106 ON, the RTC battery voltage is provided to the second switching circuit 110. Voltage creep through a diode of the second MOSFET 106, coordinated with the second control circuit 114 being in the ON arrangement allows the second MOSFET 106 to be controlled to an ON arrangement with current flowing from the drain to the source. With both the first switching circuit 104 and the second switching circuit 110 in ON arrangements, the RTC battery voltage is provided to the RTC power pin 78.

The arrangement of the RTC power control circuit 66 allows a minimal voltage drop between the RTC battery 74 and the RTC power pin 78. In some embodiments, a voltage drop of about one-hundred millivolts (100 mV or 0.1 V) is realized. In some embodiments, the RTC power pin 78 demands that a minimum of three volts (3.0 V) be delivered. In some embodiments, a standard RTC battery 74 delivers the RTC battery voltage at between about 3.2 volts and about 3.7 volts. The RTC power control circuit 66 provides a minimal voltage drop (e.g., 0.1 V) so that the RTC power pin 78 receives between about 3.1 volts and about 3.6 volts when powered by the RTC battery 74. In addition, the second switching circuit 110 protects the RTC power control system 66 from short to ground and short to battery conditions.

In some embodiments, the control circuits and switching circuits may include other components or the transistors may be replaced with other transistor types, control devices, and/or switching devices, as desired.

No claim element herein is to be construed under the provisions of 35 U.S.C. § 112(f), unless the element is expressly recited using the phrase "means for."

For the purpose of this disclosure, the term "coupled" means the joining or linking of two members directly or indirectly to one another. Such joining may be stationary or moveable in nature. For example, a circuit of an ASIC or another system, controller, or component "coupled" to another circuit represents an electrical coupling. Such joining may be achieved with a single wire, a printed circuit board, an embedded chip, a wiring harness, and/or any additional intermediate members. For example, circuit A communicably "coupled" to circuit B may signify that the circuit A communicates directly with circuit B (i.e., no intermediary) or communicates indirectly with circuit B (e.g., through one or more intermediaries).

While various circuits with particular functionality are shown in FIGS. 1-3, it should be understood that the power control circuits described herein may include any number of circuits for completing the functions described herein. For example, the activities and functionalities of the circuits described herein may be combined in multiple circuits or as a single circuit. Additional circuits with additional functionality may also be included. Further, the power control circuits discussed herein may further control other activity beyond the scope of the present disclosure.

Although specific method steps are described herein, the order of these steps may differ from what is described. For example, two or more steps may be performed concurrently or with partial concurrence. Also, some method steps that are performed as discrete steps may be combined, steps being performed as a combined step may be separated into discrete steps, the sequence of certain processes may be reversed or otherwise varied, and the nature or number of discrete processes may be altered or varied. The order or sequence of any element or apparatus may be varied or substituted according to alternative embodiments. All such modifications are intended to be included within the scope of the present disclosure as defined in the appended claims. Such variations will depend on the machine-readable media and hardware systems chosen and on designer choice. All such variations are within the scope of the disclosure.

The foregoing description of embodiments has been presented for purposes of illustration and description. It is not intended to be exhaustive or to limit the disclosure to the precise form disclosed, and modifications and variations are possible in light of the above teachings or may be acquired from this disclosure. The embodiments were chosen and described in order to explain the principals of the disclosure and its practical application to enable one skilled in the art to utilize the various embodiments and with various modifications as are suited to the particular use contemplated. Other substitutions, modifications, changes and omissions may be made in the design, operating conditions and arrangement of the embodiments without departing from the scope of the present disclosure as expressed in the appended claims.

Accordingly, the present disclosure may be embodied in other specific forms without departing from its spirit or essential characteristics. The described embodiments are to be considered in all respects only as illustrative and not restrictive. All changes which come within the meaning and range of equivalency of the claims are to be embraced within their scope.

What is claimed is:

1. An apparatus, comprising:
   a circuit structured to:
   communicate with a real-time-clock battery and to selectively communicate with a vehicle battery;
   inhibit communication between the real-time-clock battery and a controller when a first voltage is received from the vehicle battery;
   provide a communication from the real-time-clock battery to the controller when the first voltage is not received;
   inhibit electrical communication between a control circuit and a switching circuit when the first voltage is received from the vehicle battery; and
   provide communication between the control circuit and the switching circuit when the first voltage is not received.

2. The apparatus of claim 1, wherein the circuit includes a first bipolar junction transistor configured to be triggered to an ON arrangement by the first voltage received from the vehicle battery and a second bipolar junction transistor configured to be triggered to an ON arrangement in the absence of the first voltage.

3. The apparatus of claim 2, wherein the circuit is structured to provide the communication from the real-time-clock battery to the controller when the first bipolar junction transistor is in an OFF arrangement and the second bipolar junction transistor is in the ON arrangement.

4. The apparatus of claim 2, wherein the circuit includes a metal-oxide semiconductor field-effect transistor, and
   wherein a collector of the second bipolar junction transistor is in communication with a gate of the metal-oxide semiconductor field-effect transistor.

5. The apparatus of claim 1,
   wherein the control circuit is a first control circuit in communication with the real-time-clock battery and the vehicle battery;
   wherein the switching circuit is a first switching circuit in communication with the first control circuit and the real-time-clock battery; and
   wherein the circuit further includes:
      a second control circuit in communication with the real-time-clock battery and the vehicle battery; and
      a second switching circuit in communication with the second control circuit, the first switching circuit, and the controller.

6. The apparatus of claim 5, wherein the second switching circuit includes a metal-oxide semiconductor field-effect transistor, and the first switching circuit and the second switching circuit together are configured to produce one-hundred millivolts or less of voltage drop between the real-time-clock battery and the controller,
   wherein the second control circuit includes a first bipolar junction transistor configured to be triggered to an ON arrangement by the first voltage received from the vehicle battery and a second bipolar junction transistor configured to be triggered to an ON arrangement in the absence of the first voltage, and
   wherein the second control circuit is in the ON arrangement when the first bipolar junction transistor is in an OFF arrangement and the second bipolar junction transistor is in the ON arrangement.

7. A system comprising:
   a regulator structured to receive power from a vehicle battery and output a wake supply voltage greater than or equal to approximately 3.7 volts; and
   a circuit structured to:
   communicate with a real-time-clock battery;
   receive the wake supply voltage from the regulator;
   inhibit communication between the real-time-clock battery and a controller when the wake supply voltage is received from the vehicle battery;
   provide between approximately 3.0 volts and 3.7 volts from the real-time-clock battery to the controller when no wake supply voltage is received.

8. The system of claim 7, further comprising a low drop out regulator structured to receive the wake supply voltage and output a regulated output voltage to a real-time-clock power pin of the controller.

9. The system of claim 7, wherein the circuit is further structured to:
inhibit electrical communication between a control circuit and a switching circuit when the wake supply voltage is received from the vehicle battery; and
provide communication between the control circuit and the switching circuit when the wake supply voltage is not received.

10. The system of claim 7, wherein the circuit includes a first bipolar junction transistor configured to be triggered to an ON arrangement by the wake supply voltage received from the vehicle battery and a second bipolar junction transistor configured to be triggered to an ON arrangement in the absence of the wake supply voltage.

11. The system of claim 7, wherein the circuit includes:
a first control circuit in communication with the real-time-clock battery and the vehicle battery;
a first switching circuit in communication with the first control circuit and the real-time-clock battery;
a second control circuit in communication with the real-time-clock battery and the vehicle battery; and
a second switching circuit in communication with the second control circuit, the first switching circuit, and the controller.

12. A method comprising:
providing a wake supply voltage from a first battery to a circuit, wherein providing the wake supply voltage from the first battery to the circuit includes providing the wake supply voltage to a base of a bipolar junction transistor;
providing a real-time-clock battery voltage from a second battery to the circuit when the wake supply voltage is not provided; and
providing the real-time-clock battery voltage from the second battery to a controller when the wake supply voltage is not provided.

13. The method of claim 12, inhibiting communication between the second battery and the controller when the wake supply voltage is provided.

14. The method of claim 12, wherein providing the real-time-clock battery voltage from the second battery to the circuit when the wake supply voltage is not provided includes providing the real-time-clock battery voltage to a gate of a metal-oxide semiconductor field-effect transistor.

15. The method of claim 12, further comprising:
providing the wake supply voltage from the first battery to a first control circuit and a second control circuit of the circuit;
providing the real-time-clock battery voltage from the second battery to a first switching circuit and subsequently to a second switching circuit when the wake supply voltage is not provided to the second control circuit; and
providing the real-time-clock battery voltage from the second battery to the controller when the real-time-clock voltage is provided to the second switching circuit.

16. The method of claim 12, wherein the wake supply voltage is greater than or equal to 3.7 volts, and the real-time-clock voltage is between 3.0 volts and 3.7 volts.

17. The method of claim 12, wherein the voltage drop between the real-time-clock battery and the controller is one-hundred millivolts or less.

* * * * *